(12) United States Patent
Fang et al.

(10) Patent No.: US 7,878,145 B2
(45) Date of Patent: Feb. 1, 2011

(54) MONITORING PLASMA ION IMPLANTATION SYSTEMS FOR FAULT DETECTION AND PROCESS CONTROL

(75) Inventors: Ziwei Fang, Beverly, MA (US); Sung-Cheon Ko, Lexington, MA (US); Edmund J. Winder, Waltham, MA (US); Daniel Distaso, Merrimac, MA (US); Ludovic Godet, Treize Vents (FR); Bon Woong Koo, Andover, MA (US); Jay T. Scheuer, Rowley, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1369 days.

(21) Appl. No.: 10/858,582

(22) Filed: Jun. 2, 2004

(65) Prior Publication Data

US 2008/0026133 A1    Jan. 31, 2008

(51) Int. Cl.
 *C23C 16/00* (2006.01)
(52) U.S. Cl. .................................. 118/712; 118/723 E
(58) Field of Classification Search .............. 118/723 E, 118/712
 See application file for complete search history.

(56) References Cited

U.S. PATENT DOCUMENTS

| 4,807,994 A | 2/1989 | Felch et al. |
|---|---|---|
| 5,288,367 A | 2/1994 | Angell et al. |
| 5,313,067 A | 5/1994 | Houk et al. |
| 5,354,381 A | 10/1994 | Sheng |
| 5,451,784 A | 9/1995 | Loewenhardt et al. |
| 5,572,038 A | 11/1996 | Sheng et al. |
| 5,653,811 A | 8/1997 | Chan |
| 5,654,043 A | 8/1997 | Shao et al. |
| 5,658,423 A | 8/1997 | Angell et al. |
| 5,711,812 A | 1/1998 | Chapek et al. |
| 5,728,253 A | 3/1998 | Saito et al. |
| 5,780,803 A | 7/1998 | Goedicke et al. |

(Continued)

FOREIGN PATENT DOCUMENTS

EP    0 532 283 B1    3/1996

(Continued)

OTHER PUBLICATIONS

Kaeppelin et al., "Characterization of an industrial plasma immersion ion implantion reactor with a langmuir probe and an energy-selective mass spectrometer", 2002, Surface and Coatings Technology (Elsevier Science), 119-124.*

(Continued)

*Primary Examiner*—Parviz Hassanzadeh
*Assistant Examiner*—Michelle Crowell

(57) ABSTRACT

A plasma ion implantation system includes a process chamber, a source for producing a plasma in the process chamber, a platen for holding a substrate in the process chamber and a pulse source for generating implant pulses for accelerating ions from the plasma into the substrate. In one aspect, the system includes a plasma monitor configured to measure ion mass and energy in the process chamber and an analyzer configured to determine an operating condition of the system in response to the measured mass and energy. In another aspect, the system includes a data acquisition unit configured to acquire samples of the implant pulses and analyzer configured to determine an operating condition of the system based on the acquired samples.

17 Claims, 6 Drawing Sheets

U.S. PATENT DOCUMENTS

| | | | |
|---|---|---|---|
| 6,020,592 | A | 2/2000 | Liebert et al. |
| 6,050,218 | A | 4/2000 | Chen et al. |
| 6,101,971 | A | 8/2000 | Denholm et al. |
| 6,182,604 | B1 | 2/2001 | Goeckner et al. |
| 6,300,643 | B1 | 10/2001 | Fang et al. |
| 6,433,553 | B1 * | 8/2002 | Goeckner et al. ............ 324/464 |
| 6,501,082 | B1 | 12/2002 | Goto et al. |
| 6,653,852 | B1 * | 11/2003 | Benjamin ................... 324/754 |
| 6,706,541 | B1 | 3/2004 | Toprac et al. |
| 6,902,646 | B2 * | 6/2005 | Mahoney et al. ....... 156/345.24 |
| 2001/0015175 | A1 | 8/2001 | Masuda et al. |
| 2001/0042827 | A1 | 11/2001 | Fang et al. |
| 2002/0139658 | A1 | 10/2002 | Kanakasabapathy et al. |
| 2003/0101935 | A1 * | 6/2003 | Walther ................... 118/723 E |
| 2003/0193010 | A1 | 10/2003 | Tsay et al. |
| 2004/0016402 | A1 | 1/2004 | Walther et al. |

FOREIGN PATENT DOCUMENTS

| | | |
|---|---|---|
| EP | 0 994 203 A2 | 4/2000 |
| JP | 07086179 A | 3/1995 |
| JP | 2000021857 A * | 1/2000 |
| WO | WO 01/29873 A1 | 4/2001 |

OTHER PUBLICATIONS

Chhowalla, Manish, "Ion energy and charge state distributions in zirconium nitride arc plasma", Applied Physics Letters, Aug. 25, 2003, vol. 83, No. 8, 1542-1544.*

Chhowalla, Manish, "Ion energy and charge state distributions in zirconium nitride arc plasma". Applied Physics Letter, Aug. 25, 2003, vol. 83, No. 8, 1542-1544.*

Peter Kellerman, PIII Dosimetry, PDUG, Apr. 22, 1999, 1-13.

Erin C. Jones and Nathan W. Cheung, Plasma Doping Dosimetry, IEEE, 1997, pp. 42-52.

E.P. Eernisse et al., Ion Beam Porfile Monitor, Rev. Sci. Instrum., vol. 46, No. 3, Mar. 1975, pp. 266-268.

Bon-Woong Koo, et al., "Plasma Characterization of a Plasma Doping System for Semiconductor Device Fabrication"; Ion Implantation Technology 2000 Conference; Sep. 17-22, 2000; Piscataway, NJ, USA, IEEE, Sep. 17, 2000; pp. 504-507.

Amemiya K., et al.; "High Energy Aluminum Ion Implantation using a Variable Energy RFQ Ion Implanter"; Ion Implantation Technology Proceedings, 1998 International Conference on Kyoto, Japan, Jun. 22-26, 1998, Piscataway, NJ, USA, IEEE, US. vol. 1, Jun. 22, 1998, pp. 288-291.

Ziwei Fang et al., "*Study of Pulsed Plasma Doping by Langmuir Probe and Ion Mass-Energy Analyzer*" Proc. of 14$^{th}$ Int. Conf. On Ion Implantation Technology, Taos, USA, Sep. 2002, p. 399.

* cited by examiner

MONITORING PLASMA ION IMPLANTATION SYSTEMS FOR FAULT DETECTION AND PROCESS CONTROL

FIELD OF THE INVENTION

This invention relates to systems and methods for plasma ion implantation of substrates and, more particularly, to methods and apparatus for monitoring operation of plasma ion implantation systems.

BACKGROUND OF THE INVENTION

Ion implantation is a standard technique for introducing conductivity-altering impurities into semiconductor wafers. In a conventional beamline ion implantation system, a desired impurity material is ionized in an ion source, the ions are accelerated to form an ion beam of prescribed energy, and the ion beam is directed at the surface of the wafer. Energetic ions in the beam penetrate into the bulk of the semiconductor material and are embedded into the crystalline lattice of the semiconductor material to form a region of desired conductivity.

A well-known trend in the semiconductor industry is toward smaller, higher speed devices. In particular, both the lateral dimensions and the depths of features in semiconductor devices are decreasing. The implanted depth of the dopant material is determined, at least in part, by the energy of the ions implanted into the semiconductor wafer. Beamline ion implanters are typically designed for efficient operation at relatively high implant energies and may not function efficiently at the low energies required for shallow junction implantation.

Plasma doping systems have been studied for forming shallow junctions in semiconductor wafers. In a plasma doping system, a semiconductor wafer is placed on a conductive platen, which functions as a cathode and is located in a process chamber. An ionizable process gas containing the desired dopant material is introduced into the chamber, and a voltage pulse is applied between the platen and an anode or the chamber walls, causing formation of a plasma having a plasma sheath in the vicinity of the wafer. The applied pulse causes ions in the plasma to cross the plasma sheath and to be implanted into the wafer. The depth of implantation is related to the voltage applied between the wafer and the anode. Very low implant energies can be achieved. Plasma doping systems are described, for example, in U.S. Pat. No. 5,354,381, issued Oct. 11, 1994 to Sheng; U.S. Pat. No. 6,020,592, issued Feb. 1, 2000 to Liebert et al.; and U.S. Pat. No. 6,182,604, issued Feb. 6, 2001 to Goeckner et al.

In the plasma doping systems described above, the applied voltage pulse generates a plasma and accelerates positive ions from the plasma toward the wafer. In other types of plasma systems, known as plasma immersion systems, continuous or pulsed RF energy is applied to the process chamber, thus producing a continuous plasma. At intervals, negative voltage pulses, which may be synchronized with the RF pulses, are applied between the platen and the anode, causing positive ions in the plasma to be accelerated toward the wafer.

The distribution and frequency of different ion mass-to-charge ratios in the plasma has a fundamental impact on the implant dose and the implant depth profile distribution in plasma ion implantation. Many factors can impact the ion mass distribution in plasma ion implantation systems, including process chamber wall conditions, electron emission coefficients of targets and process chamber components, oxide and photoresist coatings on wafers, etc. To obtain a repeatable plasma ion implantation process, variation in these factors should be detected and compensated or neutralized, so that a repeatable ion mass distribution and intensity can be obtained for a process. This permits a repeatable ion dose and dopant depth distribution to be obtained in a plasma ion implantation process.

Mass analysis has been employed in traditional beamline ion implantation systems. However, mass analysis has been abandoned in plasma ion implantation systems in order to obtain the benefits of very high throughput in plasma-based processing. U.S. Pat. No. 6,101,971, issued Aug. 15, 2000 to Denholm et al., discloses the use of optical emission spectroscopy and mass analysis in a plasma ion implantation system. This patent does not teach the use of mass analysis for in-situ plasma state measurement or process control in plasma ion implantation systems.

In plasma ion implantation systems, short DC voltage pulses (approximately 1 to 100 microseconds) are applied to a substrate immersed in a plasma. These pulses accelerate positive ions in the plasma toward the target, causing ion implantation. The voltage and current waveforms of the DC implant pulses and variations in these waveforms can indicate problems in the implant process. Typical monitoring of plasma ion implantation includes a residual gas analyzer or optical emission spectroscopy instrumentation. This type of plasma monitoring is performed on a time scale that is too long to detect transient changes in the critical voltage and current waveforms of the DC pulses used in plasma ion implantation. The valuable process monitoring information contained in these waveforms is lost when typical plasma monitoring techniques are utilized.

SUMMARY OF THE INVENTION

According to a first aspect of the invention, plasma ion implantation apparatus is provided. The plasma ion implantation apparatus comprises a process chamber, a platen located in the process chamber for supporting a substrate, an anode spaced from the platen in the process chamber, a process gas source coupled to the process chamber, wherein a plasma containing ions of the process gas is produced in a plasma discharge region between the anode and the platen, a pulse source for applying implant pulses between the platen and the anode for accelerating ions from the plasma into a substrate, and a plasma monitor configured to measure mass and energy of ions in the process chamber. The measured ion mass and energy are indicative of an operating condition of the plasma ion implantation apparatus.

According to a second aspect of the invention, plasma ion implantation apparatus is provided. The plasma ion implantation apparatus comprises a process chamber, a platen located in the process chamber for supporting a substrate, an anode spaced from the platen in the process chamber, a process gas source coupled to the process chamber, wherein a plasma containing ions of the process gas is produced in a plasma discharge region between the anode and the platen, a pulse source for applying implant pulses between the platen and the anode for accelerating ions from the plasma into the substrate, and a data acquisition unit configured to acquire samples of the implant pulses, wherein the acquired samples are indicative of an operating condition of the plasma ion implantation apparatus.

According to a third aspect of the invention, a method is provided for plasma ion implantation of a substrate. The method comprises providing a plasma ion implantation system including a process chamber, a source for producing a plasma in the process chamber, a platen for holding a substrate in the process chamber and a pulse source for generating implant pulses for accelerating ions from the plasma into the substrate; acquiring measurements of mass and energy of ions in said process chamber; and determining an operating condition of the plasma ion implantation system based on the acquired measurements of ion mass and energy.

According to a fourth aspect of the invention, a method is provided for plasma ion implantation of a substrate. The method comprises providing a plasma ion implantation system including a process chamber, a source for producing a plasma in the process chamber, a platen for holding a substrate in the process chamber and a pulse source for generating implant pulses for accelerating ions from the plasma into the substrate; acquiring samples of said implant pulses; and determining an operating condition of the plasma ion implantation system based on the acquired samples.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
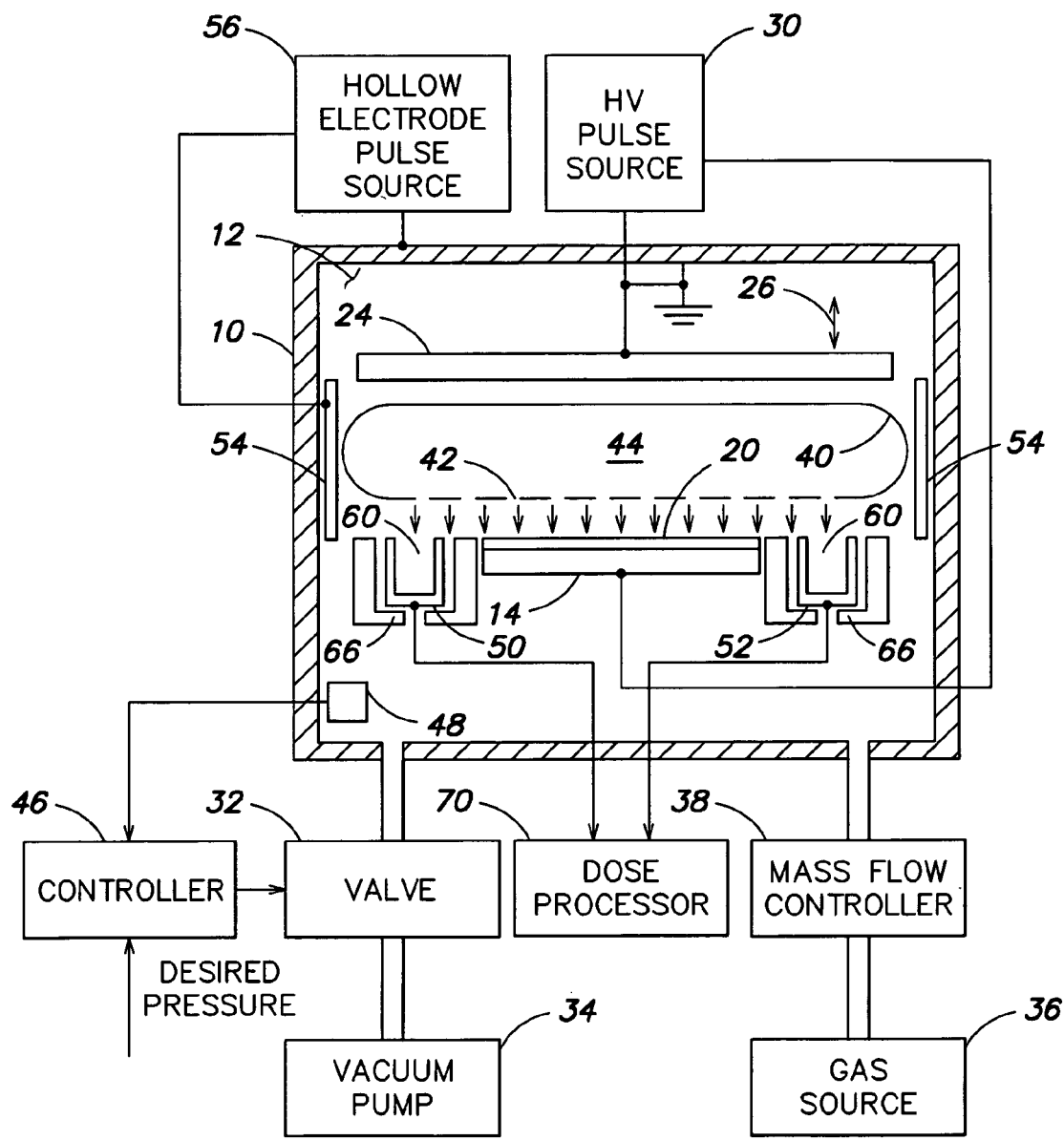
FIG. 1 is a simplified schematic block diagram of a plasma ion implantation system.

An example of a plasma ion implantation system suitable for implementation of the present invention is shown schematically in FIG. 1. Embodiments of the invention are described in connection with FIGS. 2-7. Like elements in FIGS. 1-7 have the same reference numerals.

A process chamber 10 defines an enclosed volume 12. A platen 14 positioned within chamber 10 provides a surface for holding a substrate, such as a semiconductor wafer 20. The wafer 20 may, for example, be clamped at its periphery to a flat surface of platen 14 or may be electrostatically clamped. In one embodiment, the platen has an electrically conductive surface for supporting wafer 20. In another embodiment, the platen includes conductive pins (not shown) for connection to wafer 20. In addition, platen 14 may be equipped with a heating/cooling system to control wafer/substrate temperature.

An anode 24 is positioned within chamber 10 in spaced relation to platen 14. Anode 24 may be movable in a direction, indicated by arrow 26, perpendicular to platen 14. The anode is typically connected to electrically conductive walls of chamber 10, both of which may be connected to ground. In another embodiment, platen 14 is connected to ground, and anode 24 is pulsed to a negative voltage. In further embodiments, both anode 24 and platen 14 may be biased with respect to ground.

The wafer 20 (via platen 14) and the anode 24 are connected to a high voltage pulse source 30, so that wafer 20 functions as a cathode. The pulse source 30 typically provides pulses in a range of about 20 to 20,000 volts in amplitude, about 1 to 200 microseconds in duration and a pulse repetition rate of about 100 Hz to 20 kHz. It will be understood that these pulse parameter values are given by way of example only and that other values may be utilized within the scope of the invention.

The enclosed volume 12 of chamber 10 is coupled through a controllable valve 32 to a vacuum pump 34. A process gas source 36 is coupled through a mass flow controller 38 to chamber 10. A pressure sensor 48 located within chamber 10 provides a signal indicative of chamber pressure to a controller 46. The controller 46 compares the sensed chamber pressure with a desired pressure input and provides a control signal to valve 32 or mass flow controller 38. The control signal controls valve 32 or mass flow controller 38 so as to minimize the difference between the chamber pressure and the desired pressure. Vacuum pump 34, valve 32, mass flow controller 38, pressure sensor 48 and controller 46 constitute a closed loop pressure control system. The pressure is typically controlled in a range of about 1 millitorr to about 500 millitorr, but is not limited to this range. Gas source 36 supplies an ionizable gas containing a desired dopant for implantation into the workpiece. Examples of ionizable gas include $BF_3$, $N_2$, Xe, $H_2$, $O_2$, Ar, $PH_3$, $PF_3$, $AsH_3$, $AsF_5$ and $B_2H_6$. Mass flow controller 38 regulates the rate at which gas is supplied to chamber 10. The configuration shown in FIG. 1 provides a continuous flow of process gas at a desired flow rate and constant pressure. The pressure and gas flow rate are preferably regulated to provide repeatable results. In another embodiment, the gas flow may be regulated using a valve controlled by controller 46 while valve 32 is kept at a fixed position. Such an arrangement is referred to as upstream pressure control. Other configurations for regulating gas pressure may be utilized.

The plasma ion implantation system may include a hollow cathode 54 connected to a hollow cathode pulse source 56. In one embodiment, the hollow cathode 54 comprises a conductive hollow cylinder that surrounds the space between anode 24 and platen 14. The hollow cathode may be utilized in applications which require very low ion energies. In particular, hollow cathode pulse source 56 provides a pulse voltage that is sufficient to form a plasma within chamber 12, and pulse source 30 establishes a desired implant voltage. Additional details regarding the use of a hollow cathode are provided in the aforementioned U.S. Pat. No. 6,182,604, which is hereby incorporated by reference.

One or more Faraday cups may be positioned adjacent to platen 14 for measuring the ion dose implanted into wafer 20. In the embodiment of FIG. 1, Faraday cups 50, 52, etc. are equally spaced around the periphery of wafer 20. Each Faraday cup comprises a conductive enclosure having an entrance 60 facing plasma 40. Each Faraday cup is preferably positioned as close as is practical to wafer 20 and intercepts a sample of the positive ions accelerated from plasma 40 toward platen 14. In another embodiment, an annular Faraday cup is positioned around wafer 20 and platen 14.

The Faraday cups are electrically connected to a dose processor 70 or other dose monitoring circuit. Positive ions entering each Faraday cup through entrance 60 produce in the electrical circuit connected to the Faraday cup a current that is representative of ion current. The dose processor 70 may process the electrical current to determine ion dose.

The plasma ion implantation system may include a guard ring 66 that surrounds platen 14. The guard ring 66 may be biased to improve the uniformity of implanted ion distribution near the edge of wafer 20. The Faraday cups 50, 52 may be positioned within guard ring 66 near the periphery of wafer 20 and platen 14.

The plasma ion implantation system may include additional components, depending on the configuration of the system. The system typically includes a process control system (not shown) which controls and monitors the components of the plasma ion implantation system to implement a desired implant process. Systems which utilize continuous or pulsed RF energy include an RF source coupled to an antenna or an induction coil. The system may include magnetic elements which provide magnetic fields that confine electrons and control plasma density and spatial distribution. The use of magnetic elements in plasma ion implantation systems is described, for example, in WO 03/049142, published 12 Jun. 2003, which is hereby incorporated by reference.

In operation, wafer 20 is positioned on platen 14. The pressure control system, mass flow controller 38 and gas source 36 produce the desired pressure and gas flow rate within chamber 10. By way of example, the chamber 10 may operate with $BF_3$ gas at a pressure of 10 millitorr. The pulse source 30 applies a series of high voltage pulses to wafer 20, causing formation of plasma 40 in a plasma discharge region 44 between wafer 20 and anode 24. As known in the art, plasma 40 contains positive ions of the ionizable gas from gas source 36. Plasma 40 includes a plasma sheath 42 in the vicinity, typically at the surface, of wafer 20. The electric field that is present between anode 24 and platen 14 during the high voltage pulse accelerates positive ions from plasma 40 across plasma sheath 42 toward platen 14. The accelerated ions are implanted into wafer 20 to form regions of impurity material. The pulse voltage is selected to implant the positive ions to a desired depth in wafer 20. The number of pulses and the pulse duration are selected to provide a desired dose of impurity material in wafer 20. The current per pulse is a function of pulse voltage, pulse width, pulse frequency, gas pressure and species and any variable position of the electrodes. For example, the cathode-to-anode spacing may be adjusted for different voltages.

Figure 2:
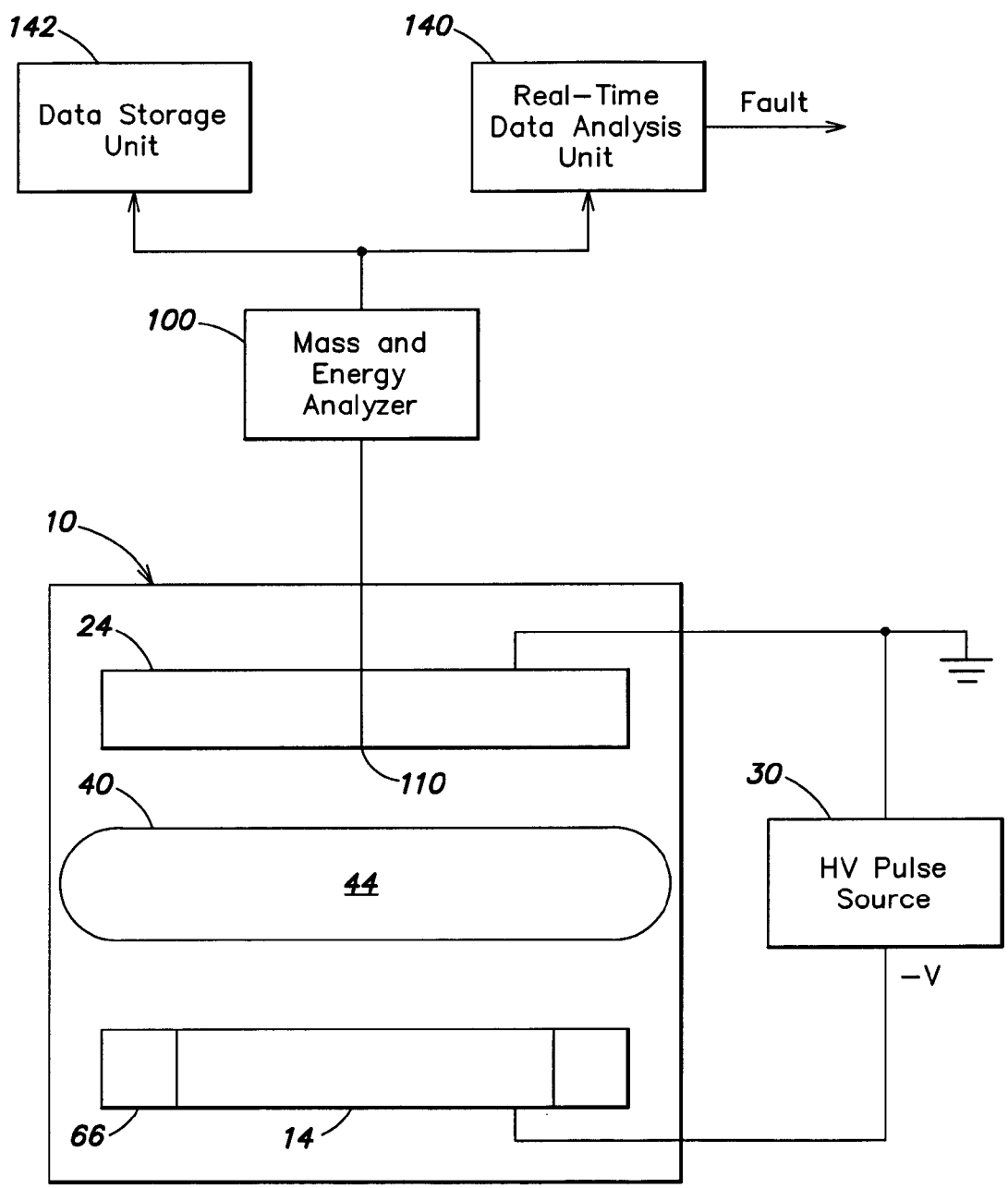
FIG. 2 is a simplified schematic block diagram of a plasma ion implantation system in accordance with a first embodiment of the invention.

A simplified schematic block diagram of a plasma ion implantation system in accordance with a first embodiment of the invention is shown in FIG. 2. System components shown in FIG. 1 have been omitted for simplicity and to facilitate an understanding of the invention. A mass and energy analyzer 100 is configured to determine the mass and energy of ions associated with plasma 40 in process chamber 10. The mass and energy analyzer 100 extracts ions from process chamber 10 and determines the mass, energy and density of the ions.

In one example, mass and energy analyzer 100 may be a model EQP mass spectrometer manufactured and sold by Hiden. The EQP mass spectrometer includes an electrostatic sector field energy analyzer followed by a quadrupole mass filter and an ion counting detector. The energy analyzer may include a pair of curved electrodes forming an electrostatic analyzer. The mass analyzer may include a quadrupole mass analyzer. The EQP mass spectrometer operates with a low internal pressure on the order of 1E-6 torr and communicates with the process chamber of the plasma ion implantation system through a small orifice, on the order of 50-300 micrometers, in order to maintain a low internal pressure. An extractor pulls ions through the orifice into the mass spectrometer for analysis.

The mass spectrometer operates such that ions with a selected energy and mass are detected at a given instant of time. The mass spectrometer may operate in a scanning mode so that ions within energy and mass scanning windows are detected. The detected signal reflects the population of the ions with different masses and energies in the plasma.

The mass and energy data is supplied to a real-time data analysis unit 140 which processes the data in accordance with one or more predetermined algorithms. In a simple example, data analysis unit 140 may process the mass and energy data to extract a specified parameter, such as percentage of a particular species, and may compare the specified parameter with desired limits. If the specified parameter falls outside the desired limits, a fault signal may be generated. The fault signal may interrupt a process controller to terminate a plasma ion implantation process or may signal an operator to take action. As an alternative to or in addition to real-time analysis, the mass and energy data may be stored in a data storage unit 142 for later analysis. By way of example only, data analysis unit 140 may be implemented as a programmed digital signal processor, and data storage unit 142 may be implemented as one or more disk drives.

The mass and energy analyzer 100 may be employed for in-situ mass and energy measurement in plasma ion implantation systems. The mass and energy analyzer may provide process fault detection capability, such as the emerging presence of an unwanted ion species that may contaminate the process results. The mass and energy analyzer may also be implemented in a closed loop process control system, for example, to adjust plasma process parameters to compensate for a drift in ion mass distribution or intensity. The mass and energy analyzer may be employed with any plasma ion source technology, such as glow discharge or RF source technology, and with either pulsed or continuous plasma sources.

As noted above, mass and energy analyzer 100 may extract ions from process chamber through an entrance orifice. The entrance orifice may have different locations within the process chamber 10.

In the embodiment of FIG. 2, an entrance orifice 110 of mass and energy analyzer 100 is located in anode 24. Mass and energy analyzer 100 thus acquires ions from plasma discharge region 44, but does not acquire ions accelerated toward platen 14.

Figure 3:
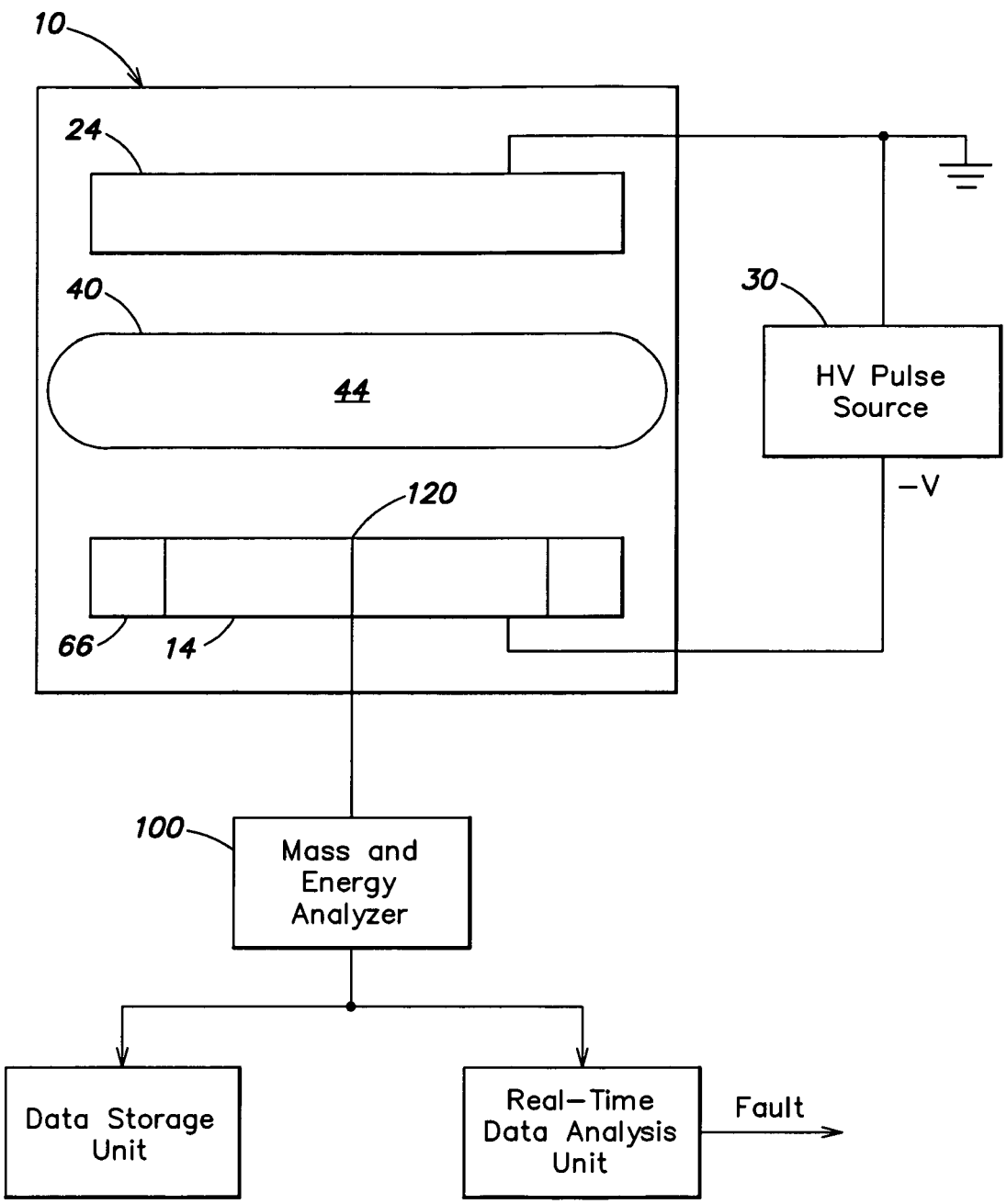
FIG. 3 is a simplified schematic block diagram of a plasma ion implantation system in accordance with a second embodiment of the invention.

In a second embodiment shown in FIG. 3, an entrance orifice 120 of mass and energy analyzer 100 is located in platen 14. In this embodiment, mass and energy analyzer 100 acquires ions accelerated toward platen 14 by pulse source 30. The embodiment of FIG. 3 requires either that a substrate not be present on platen 14 during mass and energy measurement or requires the use of a special substrate having an opening aligned with entrance orifice 120. The embodiment of FIG. 3 is most useful for maintenance and diagnostic measurements.

Figure 4:
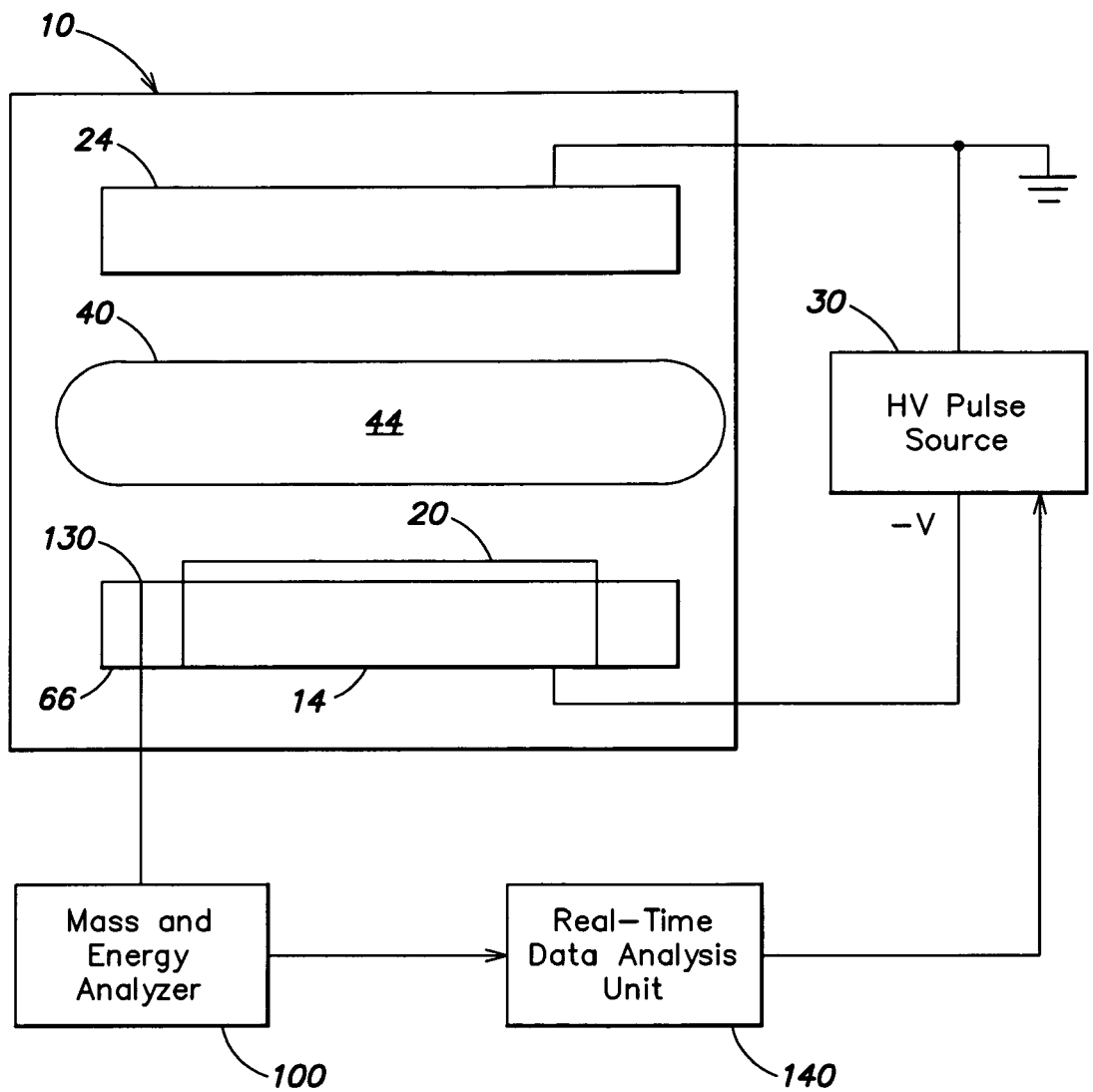
FIG. 4 is a simplified schematic block diagram of a plasma ion implantation system in accordance with a third embodiment of the invention.

In a third embodiment shown in FIG. 4, an entrance orifice 130 of mass and energy analyzer 100 is located in guard ring 66 adjacent to a substrate support surface of platen 14. In this embodiment, ion mass and energy can be analyzed during plasma ion implantation of wafer 20. Mass and energy analyzer 100 acquires ions accelerated from plasma 40 toward platen 14. The configuration of FIG. 4 permits real-time, in-situ mass and energy measurement during plasma ion implantation. It will be understood that two or more entrance orifices may be located around the periphery of platen 14. The entrance orifices may have a common connection to mass and energy analyzer 100 or may be successively connected to mass and energy analyzer 100. In other embodiments, two or more entrance orifices may be associated with respective mass and energy analyzers.

FIG. 4 further illustrates mass and energy analyzer 100 utilized in a closed loop configuration for process control. The measurements acquired by mass and energy analyzer 100 may be provided to real-time data analysis unit 140. Data analysis 140 may process the mass and energy measurements to evaluate operation of the plasma ion implantation system. If operation of the plasma ion implantation system is determined to be outside a desired range of operating parameters, the system can be adjusted or shut down. In the example of FIG. 4, the analysis unit 140 provides a control signal to pulse source 30. For example, the pulse width, pulse frequency and/or pulse amplitude may be adjusted to bring system operation within the desired range. It will be understood that different parameters of the plasma ion implantation system may be adjusted within the scope of the invention. For example, referring to FIG. 1, the desired pressure may be adjusted, the flow of process gas may be adjusted and/or hollow electrode pulse source 56 may be adjusted.

Mass and energy measurements may be acquired continuously or during specified time intervals. Thus, the mass and energy analyzer 100 may be enabled to acquire measurements during a specified time interval. More particularly, the measurements may be synchronized to operation of the plasma ion implantation system.

Figure 5:
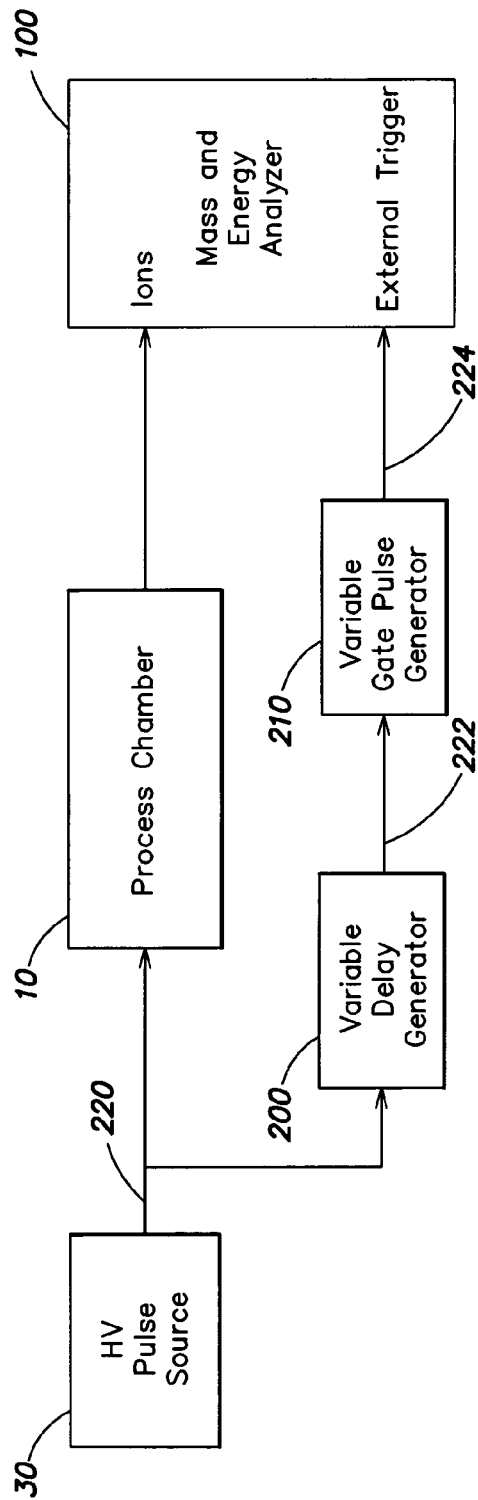
FIG. 5 is a block diagram of a system for obtaining time resolved mass and energy measurements in accordance with a fourth embodiment of the invention.

A system for synchronizing mass and energy measurements to the implant pulses produced by pulse source 30 in accordance with a fourth embodiment of the invention is shown in FIG. 5. Pulse source 30 supplies implant pulses 220 to process chamber 10 as shown in FIG. 1 and described above. Ions for analysis are extracted from process chamber 10 by mass and energy analyzer 100. The implant pulses are also supplied to a variable delay generator 200, and delay pulses 222 output by delay generator 200 are supplied to a variable gate pulse generator 210. Gating pulses 224 output by gate pulse generator 210 are supplied to mass and energy analyzer 100 as an external trigger, and mass/energy data are collected only when the gating pulses are applied.

Figure 6:
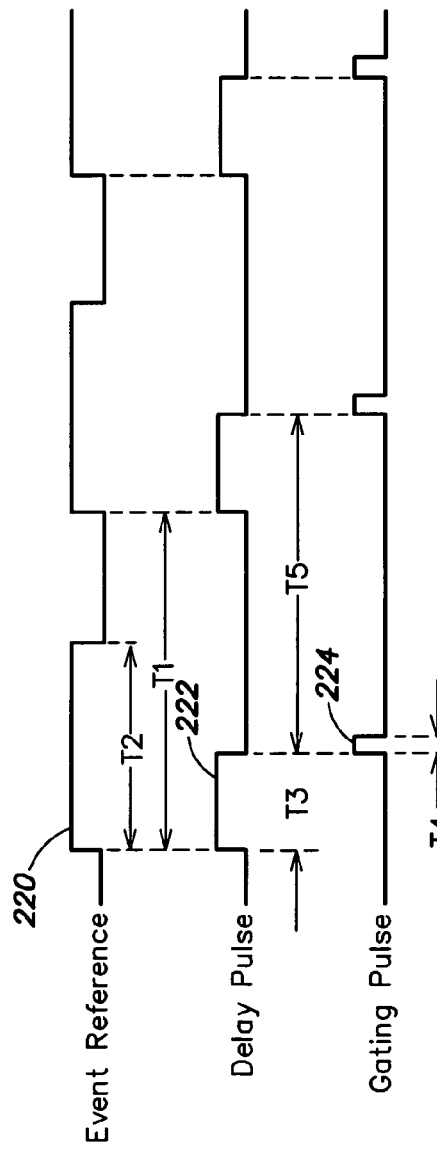
FIG. 6 is a timing diagram that illustrates operation of the system shown in FIG. 5.

Operation of the time resolved measurement system is described with reference to FIG. 6. In the timing diagram of FIG. 6, implant pulses 220 have a pulse width T2 and are repeated at time intervals T1. Each implant pulse 220 initiates delay pulse 222 having a pulse width T3. The delay pulse 222 establishes a time delay between the start of implant pulse 220 and the start of a mass and energy measurement. Delay pulse 222 initiates gating pulse 224 having a pulse width T4. Gating pulse 224 establishes a timing interval during which mass and measurements are acquired. Thus, variable delay generator 200 establishes a time delay of gating pulse 224 relative to the start of implant pulse 220, and variable gate pulse generator 210 establishes a width of gating pulse 224. It will be understood that gating pulse 224 may occur during or after implant pulse 220. Furthermore, an event other than implant pulse 220 may be used to trigger variable delay generator 200.

Figure 7:
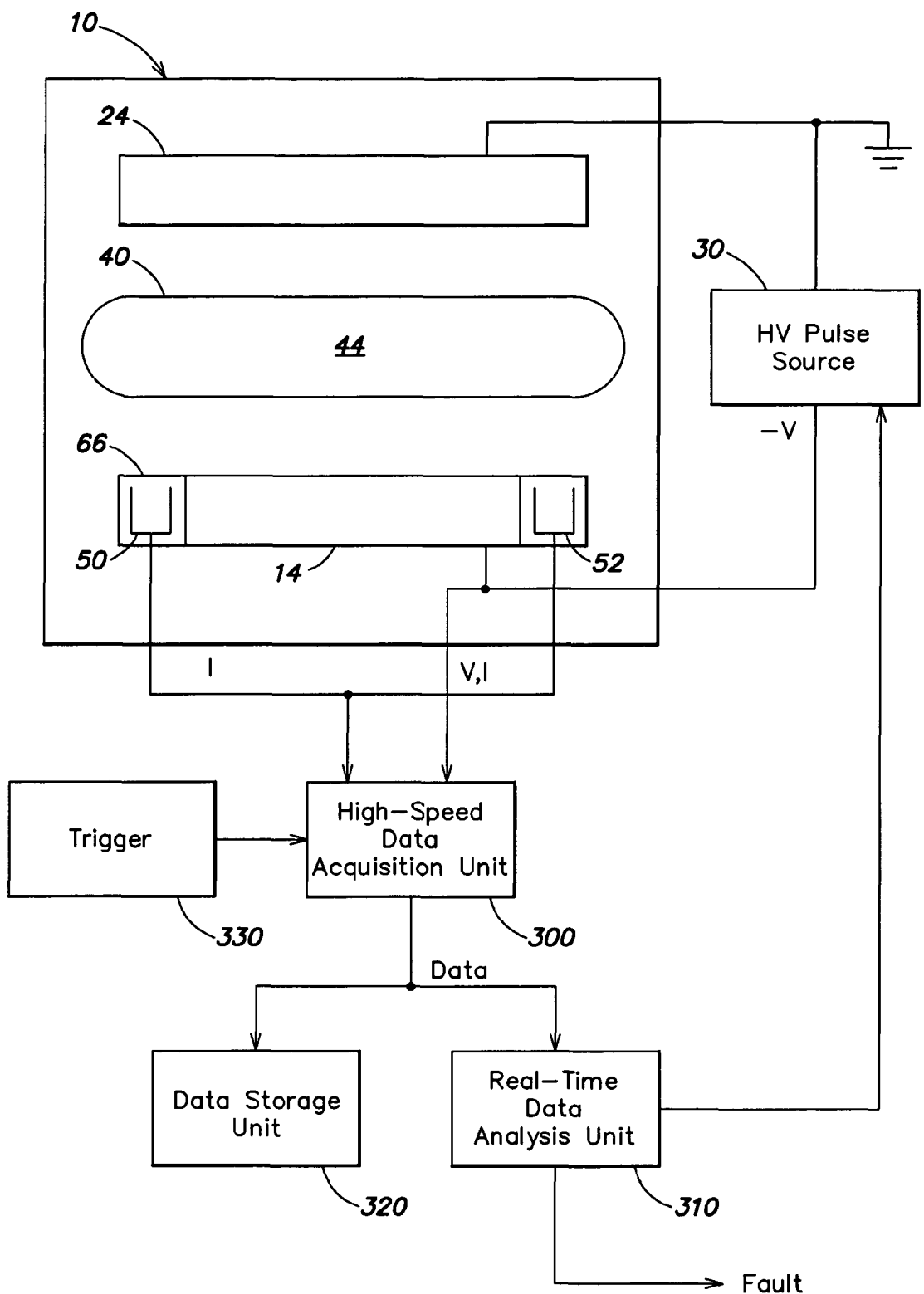
FIG. 7 is a schematic block diagram of a plasma ion implantation system in accordance with a fifth embodiment of the invention.

A schematic block diagram of a plasma ion implantation system in accordance with a fifth embodiment of the invention is shown in FIG. 7. The embodiment of FIG. 7 is based on monitoring waveforms associated with operation of the plasma ion implantation system for fault detection and/or closed loop process control. As described above, negative pulses applied to platen 14 accelerate positive ions in the plasma toward a substrate, causing ion implantation. Variations in the current and voltage waveforms of the implant pulses can indicate problems, such as arcing, in the implant process. Furthermore, in-situ high bandwidth monitoring of implant pulses with real time data analysis can provide information about changes in plasma process conditions and can enable closed loop process control.

Referring to FIG. 7, voltage and current signals from pulse source 30 are converted to low voltage signals (e.g., zero to ten volts) and are supplied to a high speed data acquisition unit 300. The data acquisition unit 300 samples the voltage and current waveforms at a user selected rate up to 10 megahertz in this embodiment. Thus, multiple samples of each implant pulse are acquired, even for implant pulses as short as one microsecond. The process parameters, such as voltage overshoot, pulse rise time, pulse fall time and voltage variation, are extracted from the high speed data using digital signal processing or equivalent techniques. Data is analyzed in real time and is marked as falling inside or outside normal operating ranges. When the data is inside normal operating ranges, a data summary is periodically forwarded to the process control system. When the data is outside normal operating ranges, a fault condition is indicated. The high sampling rate data set is stored for future analysis, and the process control system is notified of a fault condition.

As shown in FIG. 7, the data acquired by data acquisition unit 300 may be supplied to a real time data analysis unit 310 and to a data storage unit 320. Data analysis unit 310 may analyze the acquired data representative of the voltage and current waveforms and generate a fault signal as described above. Selected data may be stored in data storage unit 320 for further analysis. Data acquisition unit 300 may be triggered via a trigger unit 330, which may be manual or automatic. For example, the process control system may automatically trigger data acquisition by data acquisition unit 300 at the start of a series of implant pulses, and may trigger the halting of data acquisition when the implant pulse sequence is completed.

Data acquisition unit 300 may acquire data associated with any signal that is representative of operation of the plasma ion implantation system. As shown in FIG. 7, current waveforms generated by Faraday cups 50 and 52 are supplied to data acquisition unit 300. The dose current waveform is sampled at high speed and provides information representative of ion current implanted into the substrate.

The data acquisition arrangement shown in FIG. 7 may be utilized in an open loop configuration as described above, wherein system operation is monitored and specified conditions are reported to the process control system. In other embodiments, the data acquisition unit 300 may be part of a closed loop control system. In particular, data analysis unit 310 may determine when a specified parameter is outside a normal operating range. When an abnormal condition is detected, a control signal may be provided to pulse source 30 to adjust one or more parameters of the implant pulses, such as pulse width, pulse frequency and/or pulse amplitude, so as to adjust operation toward the normal operating range. In other embodiments, process chamber pressure, process gas flow and/or hollow electrode pulse source 56 may be adjusted in response to the abnormal condition detected by data analysis unit 310.

In one example, data acquisition unit 300 is implemented using a National Instruments model 6115 high speed data acquisition card having three ten megahertz channels, operating in a National Instruments PXI computer, a Conduant Streamstor streaming data storage unit supplies 60 megabytes per second to data storage unit 320 implemented as an array of eight 250 gigabyte hard drives. The data analysis unit 310 may include a dedicated processor which calculates implant parameter values and trends in real time and reports excursions along with appropriate feedback signals to the process control system. The parameters to be monitored and to be calculated are process-specific and recipe-specific, and may be communicated to data analysis unit 310 by the process control system prior to each data collection sequence.

Having thus described various illustrative non-limiting embodiments, and aspects thereof, modifications and alterations will be apparent to those who have skill in the art. Such modifications and alterations are intended to be included in this disclosure, which is for the purpose of illustration and explanation, and not intended to define the limits of the invention. The scope of the invention should be determined from proper construction of the appended claims and equivalents thereof.

The invention claimed is:

1. Plasma ion implantation apparatus comprising:
a process chamber;
a platen located in said process chamber for supporting a substrate;
an anode spaced from said platen in said process chamber;
a process gas source coupled to said process chamber, wherein a plasma containing ions of the process gas is produced in a plasma discharge region between said anode and said platen;
a pulse source for applying implant pulses between said platen and said anode for accelerating ions from the plasma into the substrate; and
a plasma monitor configured to measure mass and energy of ions in said process chamber, wherein the measured ion mass and energy are indicative of an operating condition of the plasma ion implantation apparatus, and wherein an entrance of the plasma monitor is positioned off the substrate and along a side of the substrate so that the entrance and the substrate share a similar vantage point with respect to the plasma discharge region.

2. Plasma ion implantation apparatus as defined in claim 1, wherein the plasma monitor comprises an ion mass and energy analyzer.

3. Plasma ion implantation apparatus as defined in claim 1, wherein an entrance of the plasma monitor is located in the anode.

4. Plasma ion implantation apparatus as defined in claim 1, wherein an entrance of the plasma monitor is located in the platen.

5. Plasma ion implantation apparatus as defined in claim 1, wherein the plasma monitor is configured to determine ion mass and energy during a selected time interval relative to said implant pulses.

6. Plasma ion implantation apparatus as defined in claim 1, wherein the plasma monitor is configured to determine ion mass and energy during an acquisition time interval.

7. Plasma ion implantation apparatus as defined in claim 1, wherein the plasma monitor is configured to perform a time-averaged measurement of ion mass and energy.

8. Plasma ion implantation apparatus as defined in claim 1, further comprising an analysis unit for determining an operating condition of the plasma ion implantation apparatus in response to the measured ion mass and energy, and a controller for controlling a parameter of the plasma ion implantation apparatus in response to the determined operating condition.

9. Plasma ion implantation apparatus as defined in claim 1, wherein the plasma monitor is configured for scanning measurement with respect to ion mass.

10. Plasma ion implantation apparatus as defined in claim 1, wherein the plasma monitor is configured for scanning measurement with respect to ion energy.

11. Plasma ion implantation apparatus as defined in claim 1, wherein the entrance of the plasma monitor comprises an entrance orifice.

12. Plasma ion implantation apparatus as defined in claim 1, wherein the plasma monitor is configured to measure ion mass and energy in a predetermined time interval during each of said pulses.

13. Plasma ion implantation apparatus as defined in claim 1, wherein the plasma monitor is configured to measure ion mass and energy in a predetermined time interval after each of said pulses.

14. Plasma ion implantation apparatus as defined in claim 1, wherein the plasma monitor measures a distribution of ion masses in said process chamber.

15. Plasma ion implantation apparatus as defined in claim 1, wherein the plasma monitor measures a distribution of ion energies in said process chamber.

16. Plasma ion implantation apparatus as defined in claim 1, further comprising a guard ring positioned about the platen, wherein the entrance of the plasma monitor is located in the guard ring, and wherein the pulse source biases the platen and the guard ring with the implant pulses so the entrance to the plasma monitor and the substrate are similarly biased.

17. Plasma ion implantation apparatus as defined in claim 1, wherein the entrance of the plasma monitor is configured to receive ions during each of the implant pulses that accelerate ions from the plasma into the substrate.

* * * * *